(12) United States Patent
Klapper

(10) Patent No.: US 9,366,711 B2
(45) Date of Patent: Jun. 14, 2016

(54) TEST DEVICE, TEST SYSTEM AND METHOD FOR TESTING A POWER ENGINEERING TEST OBJECT

(71) Applicant: OMICRON Electronics GmbH, Klaus (AT)

(72) Inventor: Ulrich Klapper, Rankweil (AT)

(73) Assignee: OMICRON ELECTRONICS GMBH, Klaus (AT)

(*) Notice: Subject to any disclaimer, the term of this patent is extended or adjusted under 35 U.S.C. 154(b) by 409 days.

(21) Appl. No.: 13/868,198

(22) Filed: Apr. 23, 2013

(65) Prior Publication Data

US 2013/0307558 A1 Nov. 21, 2013

(30) Foreign Application Priority Data

May 15, 2012 (EP) .................................. 12003838

(51) Int. Cl.
| | |
|---|---|
| *G01R 31/00* | (2006.01) |
| *G01R 31/327* | (2006.01) |
| *G01R 31/34* | (2006.01) |
| *G01R 31/02* | (2006.01) |
| *G01R 31/08* | (2006.01) |

(52) U.S. Cl.
CPC .............. *G01R 31/00* (2013.01); *G01R 31/021* (2013.01); *G01R 31/027* (2013.01); *G01R 31/083* (2013.01); *G01R 31/327* (2013.01); *G01R 31/343* (2013.01)

(58) Field of Classification Search
CPC .... G01R 31/00; G01R 31/027; G01R 31/021; G01R 31/343; G01R 31/083; G01R 31/327
USPC ........................................................ 324/537
See application file for complete search history.

(56) References Cited

U.S. PATENT DOCUMENTS

| | | | | |
|---|---|---|---|---|
| 4,785,233 | A * | 11/1988 | Coleman ................ | G01R 29/20 324/605 |
| 5,083,094 | A | 1/1992 | Forsberg | |
| 6,445,196 | B1 | 9/2002 | White | |
| 6,504,381 | B1 * | 1/2003 | Wang ..................... | G01R 31/14 324/509 |
| 6,693,436 | B1 * | 2/2004 | Nelson ............. | G01R 31/31922 324/537 |
| 2002/0111162 | A1 * | 8/2002 | Wendisch ........... | H04L 12/2697 455/423 |
| 2002/0173927 | A1 | 11/2002 | Vandiver | |
| 2007/0098600 | A1 * | 5/2007 | Kayyem ................ | B01L 3/5027 422/400 |
| 2010/0066376 | A1 * | 3/2010 | Klapper ............. | G01R 31/3274 324/418 |

(Continued)

FOREIGN PATENT DOCUMENTS

| | | |
|---|---|---|
| EP | 0258023 A2 | 2/1988 |
| GB | 836805 | 6/1960 |
| JP | 1993-288775 | 11/1993 |

(Continued)

*Primary Examiner* — Arleen M Vazquez
*Assistant Examiner* — Robert P Alejnikov, Jr.
(74) *Attorney, Agent, or Firm* — Seyfarth Shaw LLP; Brian Michaelis

(57) ABSTRACT

In order to test a power engineering test object (14), a test signal is generated by a first test device (2), which is supplied by the first test device (2) to a second test device (3) to be amplified by the same and to be output to the power engineering test object (14). Further, the test signal may be applied by the first test device (2) to the power engineering test object (14), the test signal preferably being time-synchronously output by the first test device (2) and the second test device (3) to the power engineering test object (14).

18 Claims, 2 Drawing Sheets

(56) References Cited

U.S. PATENT DOCUMENTS

2010/0201373 A1* 8/2010 Sato .................. G01R 31/024
 324/537
2012/0005517 A1* 1/2012 Foster .................. G06F 1/10
 713/500

FOREIGN PATENT DOCUMENTS

| | | |
|---|---|---|
| JP | 2000-083321 | 3/2000 |
| JP | 2005-265484 | 9/2005 |
| KR | 100856563 B1 | 9/2008 |

* cited by examiner

TEST DEVICE, TEST SYSTEM AND METHOD FOR TESTING A POWER ENGINEERING TEST OBJECT

RELATED CASE INFORMATION

The present invention claims priority from EP Application No. 12003838.5, filed May 15, 2012 which is incorporated herein by reference in its entirety.

BACKGROUND OF THE INVENTION

The invention relates to a test device, a test system and a method for testing a power engineering test object. In particular, the invention relates to a test device, a test system and a method for testing and checking, respectively, operating resources in electrical high voltage or medium voltage systems, such as power transformers, current converters, voltage converters, circuit breakers, generators, motors or cable systems, protection relays, etc.

Modern test devices for operating resources in electrical high voltage and medium voltage systems usually comprise a processor or a controller which calculates a desired signal waveform for a test signal, e.g., a variable sinusoidal signal waveform, a digital-to-analog converter for converting the thus generated signal waveform into an analog test signal, and an amplifier for amplifying the test signal to, thereby, obtain the test signal with a desired amplitude.

However, depending on the choice of the components used in the respective test device, the respectively obtainable amplitude range is limited. Therefore, in conventional test environments, separate external amplifiers are used for certain applications, which are supplied with the respective test signal and output the thus amplified test signal to the respective test object. However, such separate external amplifiers, whose functionality is limited to the amplifier functionality, increase the costs associated with the test system and the test environment, respectively.

It is therefore the object underlying the present invention to provide a possibility to expand the range of application of a test environment with simple means and to be able to test a power engineering test object with an increased amplitude range.

SUMMARY OF THE INVENTION

According to the invention, a test device, which is configured for testing a power engineering test object, in particular an operating resource of a medium voltage or high voltage system, is used for amplifying a test signal of another test device. The amplifier of the test device, which is anyway provided in the signal path that serves to generate an own test signal, is thus used as an additional amplifier for the test signal of the other test device.

Both test devices may have a substantially similar configuration, as that which has been described before. It is only necessary that the test device serving as the additional amplifier has an input for feeding in or supplying the test signal of the other test device, while the other test device has a separate output for decoupling and outputting, respectively, the corresponding test signal. Preferably, both test devices have an identical configuration or structure, wherein the input of that test device which generates the actual test signal and the additional output of that test device which serves as the additional amplifier may remain unused.

The test device, which can be supplied with the test signal of the other test device, can thus be operated optionally either as a conventional test device for generating an own test signal or, in an "amplifier mode", as an amplifier for the test signal of the other test device.

In case the test device is used as an amplifier, the amplified test signal of the other test device can be applied to the test object by this test device instead of the test signal normally generated by the test device; the test response of the test object may be evaluated by one or both of the test devices. Overall, compared to conventional test devices, the amplitude and performance ranges available for the test of the test object thus can be expanded significantly with simple means, as a rule a doubling of the performance range being achievable by the described approach. For this purpose, the further test device is used, which is provided in the respective test environment anyway. A separate and expensive amplifier is not necessary.

The test signal, which is to be amplified, may be supplied to the test device operated in the "amplifier mode" by the other test device via an analog or a digital interface, e.g., USB, Ethernet, Ethercat, IEC 61850. Preferably, the transmission of the test signal is carried out via a digital interface as, in this case, a compensation for the run time of the digital data can be realized in the test device with relatively simple measures to ensure a time-synchronous output of sample values of the test signal to the test object by both test devices. Due to the run time of the test signal via the respectively implemented interface, undesired phase shifts may occur between the originally generated test signal and the test signal amplified by the test device operated in the "amplifier mode"; these phase shifts may amount to some degrees in the case of a test signal having a frequency in the range of 50 Hz. If the run time of the test signal via the interface is compensated for, theoretically an arbitrary phase accuracy can be achieved.

For example, the run time compensation may be effected by a user by adjusting a correction value at the test device operated in the "amplifier mode".

As the run time, however, usually is not constant and thus not known, it is advantageous if in the case of a digital interface the sample values of the test signal to be amplified are provided and transmitted with time information in the form of a time stamp, so that the test device serving as the amplifier can output the individual sample values in each case at the exactly correct time points. For this purpose, the test device may comprise an integrated real time clock.

Alternatively or additionally, according to a further embodiment of the invention, the run time compensation is effected by use of a method described in the IEEE 1588 standard. The run time compensation may also be simplified by the usage of a digital Ethercat interface as this interface generates a clock that is time-synchronous with the transmitter, and this clock may be used to synchronize the individual digital sample values of the test signal to be amplified with the clock.

BRIEF DESCRIPTION OF THE DRAWINGS

In the following, the invention will be described by means of illustrative embodiments with reference to the drawings.

DETAILED DESCRIPTION OF THE INVENTION

Figure 1:
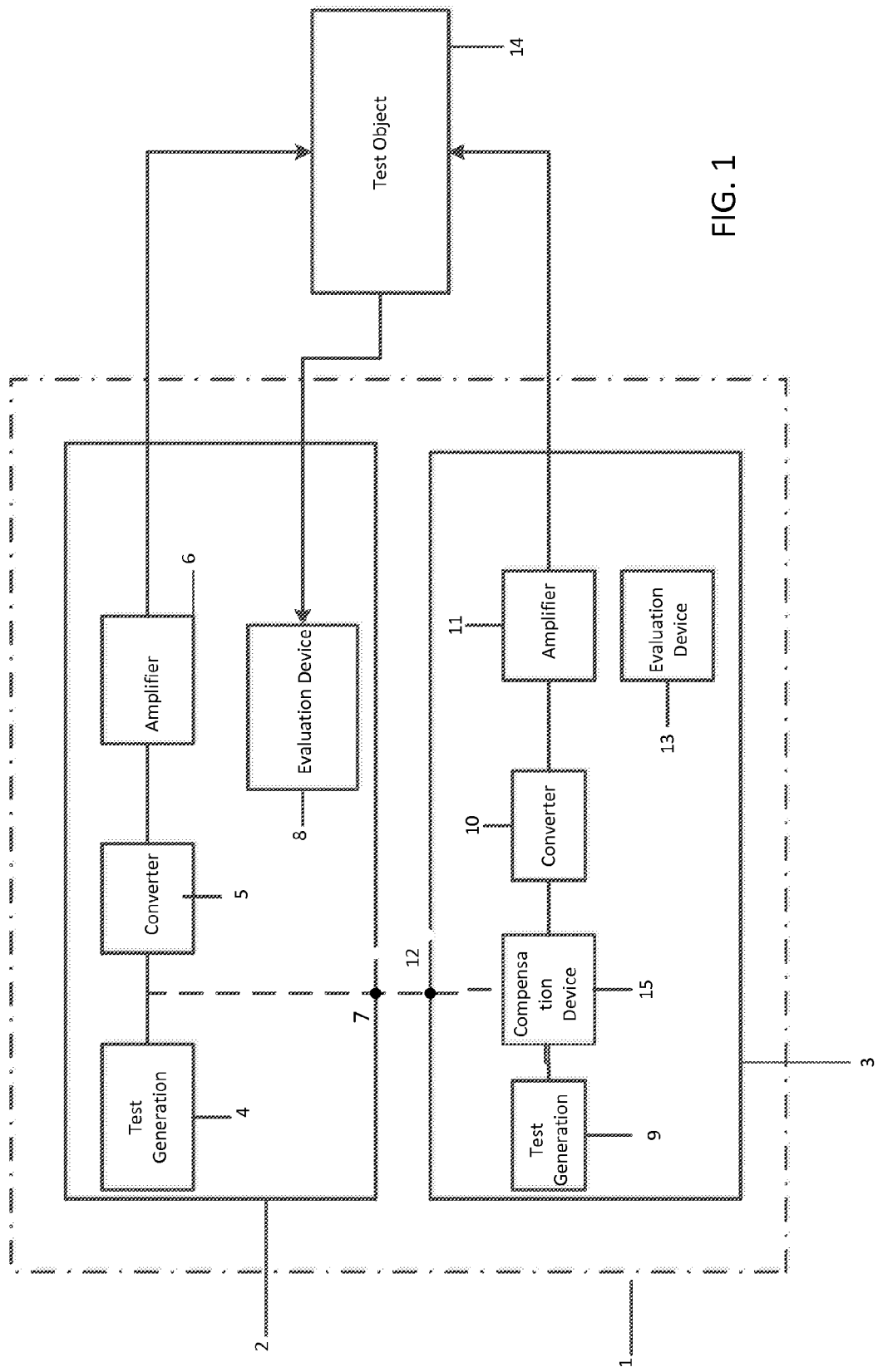
FIG. 1 shows a schematic circuit diagram of a test system for testing a power engineering test object according to an embodiment of the invention.

FIG. 1 shows a circuit diagram of a test system 1. The test system 1 comprises a first test device 2 and a second test device 3. Each test device 2, 3 is a test device for testing operating resources in electrical high or medium voltage systems, such as power transformers, current converters, voltage converters, circuit breakers, generators, motors or cable systems, protection relays, etc.

The design or configuration of both test devices 2, 3 is similar in that both test devices comprise a test signal generation device 4 and 9, respectively, in connection with a digital-to-analog converter 5 and 10, respectively, and an amplifier 6 and 11, respectively. The test signal generation devices 4, 9 may comprise a microprocessor or a controller which calculates a signal waveform that is suitable for the respectively desired test signal, for example in the form of a variable sinusoidal signal, the signal waveform being converted into a corresponding analog test signal by the respective downstream digital-to-analog converter 5, 10. The amplifier 6 and 11, respectively, amplifies the respective analog test signal and outputs the same via an output of the respective test device.

In this way, each of both test devices 2, 3 can generate a test signal for testing a test object 14 schematically shown in FIG. 1, the response of the test object 14 being detected and evaluated in a suitable manner by an evaluation device 8 and 13, respectively.

In the embodiment shown in FIG. 1, however, the second test device 3 is not operated like a "normal" test device similar to the test device 2, but the second test device 3 is coupled to the test device 2 such that, in an "amplifier" mode, it functions as an amplifier for the test signal generated by the first test device 2.

For this purpose, the first test device 2 has a separate output 7 to decouple the test signal at a suitable position from the signal path of the test device 2, while the second test device 3 has a separate input 12 to feed the test signal received from the first test device 2 into the own signal path comprising the amplifier 11. In the embodiment shown in FIG. 1, the decoupling of the test signal is effected in the first test device 2 between the test signal generation device 4 and the digital-to-analog converter 5, so that the feeding in of the test signal into the signal path of the second test device 3 correspondingly is effected between the test signal generation device 9 (which is inactive in the "amplifier" mode) and the digital-to-analog converter 10.

The test signal of the first test device 2, which is supplied to the second test device 3 in this manner, is thus converted into a corresponding analog signal by the digital-to-analog converter 10 of the second test device 3 and amplified by the amplifier 11 to be output with the desired amplitude to the test object 14.

Thus, the same test signal is applied to the test object by both test devices 2, 3, the second test device 3 merely functioning as an amplifier for the test signal generated by the first test device 2. In principle, the test response of the test object 14 may be evaluated by both test devices; in FIG. 1, however, it is assumed that the evaluation of the test signal response of the test object 14 is effected by the evaluation device 8 of the first test device.

The test signal to be amplified may be supplied by the test device 2 to the second test device 3 operated in the "amplifier mode" by means of the terminals or connections 7 and 12 via an analog or a digital interface, such as a USB interface, an Ethernet interface, an Ethercat interface, or an interface according to the IEC 61850 standard. Preferably, the transmission of the test signal is effected via a digital interface as in this case a compensation for the run time of the digital data can be realized with relatively simple measures in the test device 3 to ensure a time-synchronous output of sample values of the test signal to the test object 14 by both test devices 2, 3.

Due to the run time of the test signal via the respectively implemented interface comprising the terminals 7, 12, undesired phase shifts may occur between the originally generated test signal of the first test device 2 and the test signal amplified by the second test device 3 that is operated in the "amplifier mode". If the run time of the test signal through the interface is compensated for, theoretically an arbitrary phase accuracy can be achieved between the test signal of the first test device 2 and the amplified version of this test signal as generated by the second test device 3.

For this purpose, the second test device 3 is equipped with a run time compensation device 15 which, in the embodiment shown in FIG. 1, is arranged in front of the digital-to-analog converter 10 to perform a digital run time compensation. Alternatively, an analog run time compensation, i.e., between the digital-to-analog converter 10 and the amplifier 11, is possible as well.

The run time compensation, for example, may be effected by a user by adjustment of a correction value at the second test device 3 operated in the "amplifier mode"; in this case, the run time compensation device 15 may comprise a corresponding adjustment member, such as a digital potentiometer, to adjust the respectively desired correction value for the run time compensation. Likewise, the correction value may also be applied per software to the test signal. Finally, the test signal, to which this time correction value has been applied, is output by the amplifier 11 to the test object 14.

As the run time usually is not constant and, therefore, not known, it is advantageous in the case of a digital interface to provide the sample values of the test signal to be amplified in the second test device 3 with time information in the form of a time stamp by the first test device 2 and to transmit the sample values together with the time information, so that the second test device 3 functioning as the amplifier can output the individual sample values at exactly the correct time points. For this purpose, the run time compensation device 15 of the second test device 3 may comprise an integrated real time clock, so that the second test device 3 can output the individual sample values of the test signal at the respectively correct time points related to this real time clock.

Likewise, the run time compensation may be effected by the use of a method described in the IEEE 1588 standard.

According to a further variant, the run time compensation can be simplified by the use of a digital Ethercat interface between the test devices 2 and 3, as this interface generates a clock at the receiver which is time-synchronous with the transmitter; this clock can be used by the run time compensation device 15 to synchronize with this clock in the second test device 3 the individual digital sample values of the test signal to be amplified.

Figure 2:
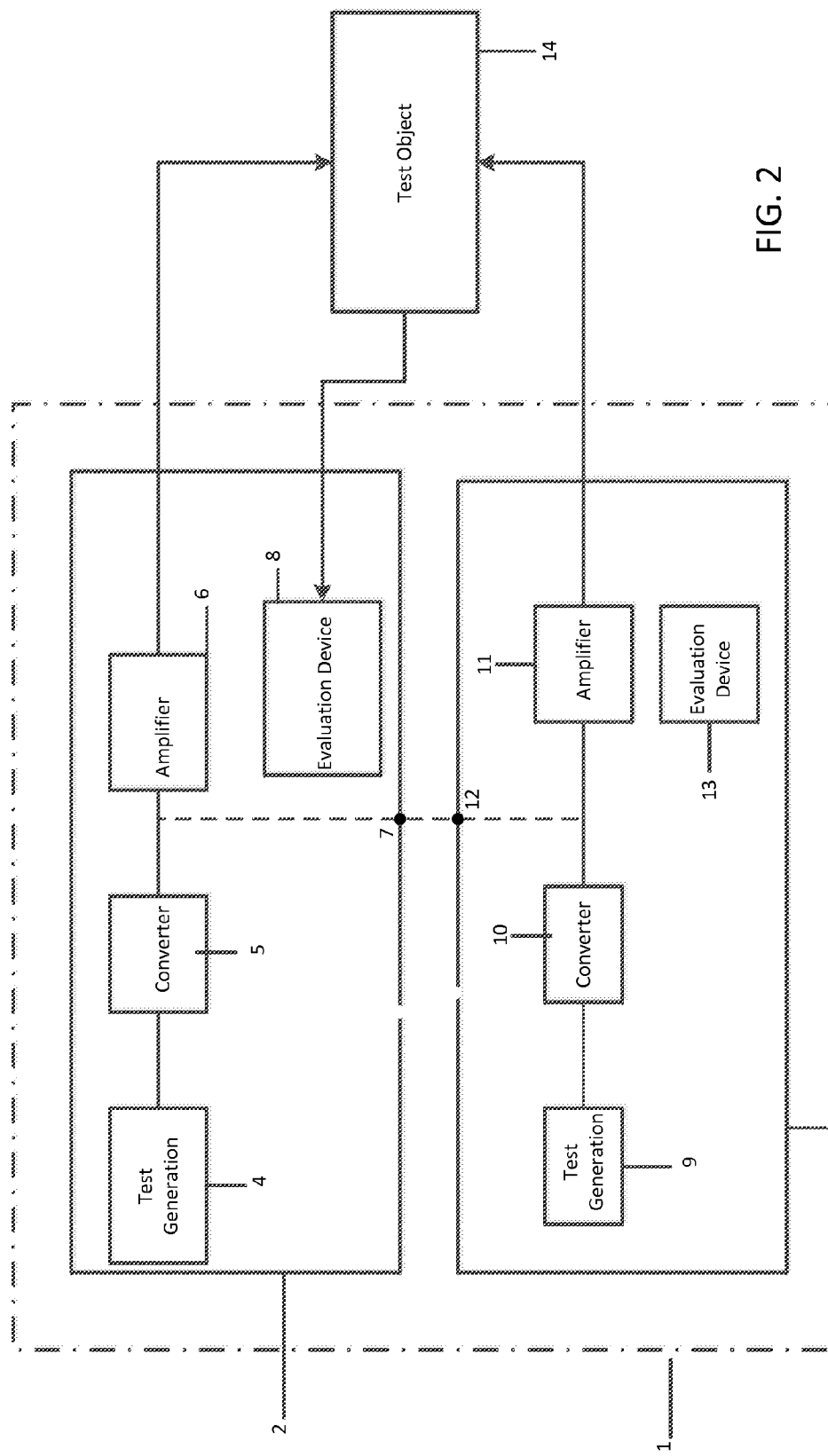
FIG. 2 shows a schematic circuit diagram of a test system for testing a power engineering test object according to a further embodiment of the invention.

In FIG. 2, a further embodiment of a test system according to the invention is shown.

The embodiment shown in FIG. 2 differs from the embodiment shown in FIG. 1 only in that, according to FIG. 2, the decoupling of the test signal via the output 7 is effected in the first test device 2 between the digital-to-analog converter 5 and the amplifier 6, and that the decoupled test signal correspondingly is fed via the input 12 into the signal path of the second test device 3 between the digital-to-analog converter 10 and the amplifier 11.

In the case of the analog decoupling of the test signal shown in FIG. 2 via the output 7 of the test device 2, which is connected to the output of the digital-to-analog converter 5 of the test device 2, the run time compensation device 15 shown in FIG. 1 may be omitted as in this case if at all a marginal phase offset between both test device 2, 3 can be assumed, and in addition the phase offset in the amplifiers 6, 11 of both test devices 2, 3 should be equal. Alternatively, however, the embodiment shown in FIG. 2 may be supplemented by a run time compensation similar to the embodiment shown in FIG. 1. Apart from that, full reference can be made to the above explanations in connection with FIG. 1.

Although the devices, systems, and methods have been described and illustrated in connection with certain embodiments, many variations and modifications will be evident to those skilled in the art and may be made without departing from the spirit and scope of the disclosure. The discourse is thus not to be limited to the precise details of methodology or construction set forth above as such variations and modification are intended to be included within the scope of the disclosure.

The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A test device for testing a power engineering test object, comprising:
    a signal path comprising a test signal generation device for generating a test signal and an amplifier device for amplifying the test signal to output the amplified test signal via a first output for testing the power engineering test object, and
    second output for decoupling the test signal from the signal path and for outputting the test signal to a further test device, the second output outputting sample values for the test signal together with corresponding time information to the further test device to control a timewise output of the sample values by the further test device.

2. The test device according to claim 1,
    wherein the signal path of the test device comprises a digital-to-analog converter device between the test signal generator device and the amplifier device, the test signal being decoupled via the second output between the test signal generator device and the digital-to-analog converter device.

3. The test device according to claim 1,
    wherein the signal path of the test device comprises a digital-to-analog converter device between the test signal generator device and the amplifier device, the test signal being decoupled via the second output between the digital-to-analog converter device and the amplifier device.

4. The test device according to claim 1,
    wherein the second output comprises a digital interface for decoupling the test signal to the further test device.

5. The test device according to claim 4,
    wherein the digital interface is an Ethernet interface, a USB interface, an Ethercat interface, or an interface according to the IEC 61850 standard.

6. The test device according to claim 1,
    wherein the test device is configured for testing an operating resource of an electrical high voltage or medium voltage system.

7. A test device for testing a power engineering test object, comprising:
    a signal path comprising a test signal generation device for generating a test signal and an amplifier device for amplifying the test signal to output the amplified test signal via an output for testing the power engineering test object,
    an input to the signal path for supplying a test signal decoupled from a further test device to the signal path and for outputting this test signal amplified by the amplifier device of the signal path via the output for testing the power engineering test object, and
    a compensation device for compensating for a signal run time of the test signal decoupled from the further test device to output the test signal in a time-synchronous manner with the test signal output to the power engineering test object by the further test device.

8. The test device according to claim 7,
    wherein the signal path of the test device comprises a digital-to-analog converter device between the test signal generator device and the amplifier device, the test signal being supplied via the input between the test signal generator device and the digital-to-analog converter device.

9. The test device according to claim 7,
    wherein the signal path of the test device comprises a digital-to-analog converter device between the test signal generator device and the amplifier device, the test signal being supplied via the input between the digital-to-analog converter device and the amplifier device.

10. The test device according to claim 7,
    wherein the compensation device is configured such that it compensates for the run time of the test signal by means of an adjustable correction value.

11. The test device according to claim 7,
    wherein the compensation device is configured such that it causes the output of sample values of the test signal decoupled from the further test device and supplied to the signal path to the power engineering test object at time points that correspond to time information transmitted together with the test signal by the further test device.

12. The test device according to claim 7,
    wherein the compensation device is configured such that it performs the run time compensation by application of a method according to the IEEE 1588 standard, or by outputting sample values of the test signal decoupled from the further test device and supplied to the signal path time-synchronously with a clock of an interface, via which the test signal is transmitted by the further test device to the test device, to the power engineering test object.

13. The test device according to claim 7,
    wherein the input comprises a digital interface for supplying the test signal from the further test device to the signal path.

14. A test system for testing a power engineering test object, comprising:
    a first test device for testing the power engineering test object, wherein the first test device comprises a first signal path for generating a test signal, amplifying the test signal and outputting the amplified test signal via a first output for testing the power engineering test object, and wherein the first test device comprises second output for decoupling the test signal from the first signal path of the first device, and wherein the test device is configured to output sample values of the test signal together with corresponding time information via the second output to a second test device to control the timewise output of these sample values by the second test device, and the second test device for testing the power engineering test object, wherein the second test device comprises a second signal path for generating a test signal, amplifying the test signal and outputting the amplified test signal via a third output for testing the power engineering test object, and wherein the second test device comprises an input for supplying the test signal decoupled via the second output of the first test device to the second signal path of the second test device to amplify and output via the third output of the second test device the test signal of the first test device for testing the power engineering test object, wherein the second test device comprises a compensation device for compensating for a signal run time of the test signal decoupled from the first test device to output this test signal to the power engineering test object in a time-synchronous manner with the test signal which is also output to the power engineering test object by the first test device.

15. A method for testing a power engineering test object, comprising:

generating a test signal by means of a first test device which is configured for testing the power engineering test object, decoupling the test signal from a signal path of the first test device, supplying the test signal decoupled from the first test device to a signal path of a second test device which is configured for testing the power engineering test object, amplifying the test signal supplied to the signal path of the second test device, and outputting the amplified test signal via an output of the second test device for testing the power engineering test object.

16. The method according to claim 15, wherein the test signal in addition is amplified in the signal path of the first test device and is output via an output of the first test device for testing the power engineering test object.

17. The method according to claim 16, wherein the test signal is output by the second test device time-synchronously with the test signal output by the first test device.

18. The method according to claim 15, wherein the first test device has a first signal path comprising a test signal generation device for generating a test signal and an amplifier device for amplifying the test signal to output the amplified test signal via a first output for testing the power engineering test object, and a second output for decoupling the test signal from the first signal path and for outputting the test signal to the second test device, and wherein the second test device has a second signal path comprising a test signal generation device for generating a test signal and an amplifier device for amplifying the test signal to output the amplified test signal via a third output for testing the power engineering test object, and an input for supplying a test signal decoupled from the first signal path and for outputting this test signal amplified by the amplifier device of the first signal path via the second output for testing the power engineering test object.

* * * * *